(12) United States Patent
Xu et al.

(10) Patent No.: US 7,239,188 B1
(45) Date of Patent: Jul. 3, 2007

(54) LOCKED-LOOP INTEGRATED CIRCUITS HAVING SPEED TRACKING CIRCUITS THEREIN

(75) Inventors: Chao Xu, Suwanee, GA (US); Al Xuefeng Fang, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 10 days.

(21) Appl. No.: 11/264,111

(22) Filed: Nov. 1, 2005

(51) Int. Cl.
*H03L 7/06* (2006.01)
(52) U.S. Cl. ...................................... 327/156; 327/157
(58) Field of Classification Search ................ 327/141, 327/144–161; 331/16, 17
See application file for complete search history.

(56) References Cited

U.S. PATENT DOCUMENTS

| | | | |
|---|---|---|---|
| 5,629,650 A | 5/1997 | Gersbach et al. | |
| 5,686,864 A * | 11/1997 | Martin et al. | 331/1 A |
| 5,727,037 A | 3/1998 | Maneatis | |
| 5,942,949 A * | 8/1999 | Wilson et al. | 331/17 |
| 5,982,836 A * | 11/1999 | Sakae et al. | 375/376 |
| 6,031,427 A * | 2/2000 | Black | 331/4 |
| 6,043,695 A * | 3/2000 | O'Sullivan | 327/157 |
| 6,275,115 B1 * | 8/2001 | Egawa | 331/11 |
| 6,329,882 B1 | 12/2001 | Fayneh et al. | |
| 6,411,144 B1 * | 6/2002 | Matsuno | 327/157 |
| 6,661,267 B2 * | 12/2003 | Walker et al. | 327/159 |
| 6,744,293 B1 * | 6/2004 | Fu et al. | 327/158 |
| 6,784,707 B2 * | 8/2004 | Kim et al. | 327/158 |
| 6,867,627 B1 | 3/2005 | Murtagh | |
| 6,894,569 B2 | 5/2005 | Fayneh et al. | |
| 6,903,586 B2 | 6/2005 | Abbasi et al. | |
| 6,952,124 B2 * | 10/2005 | Pham | 327/156 |
| 6,963,234 B2 * | 11/2005 | Bidenbach | 327/158 |
| 6,987,409 B2 * | 1/2006 | Kim et al. | 327/158 |
| 7,061,332 B2 * | 6/2006 | Siniscalchi et al. | 331/16 |
| 7,109,764 B2 * | 9/2006 | Sakamoto et al. | 327/156 |

OTHER PUBLICATIONS

Maneatis, John G., "Low-Jitter Process-Independent DLL and PLL Based on Self-Biased Techniques," IEEE Journal of Solid-State Circuits, vol. 31, No. 11, Nov. 1996.

Mansuri et al., "A Low-Power Adaptive Bandwidth PLL and Clock Buffer with Supply-Noise Compensation," IEEE Journal of Solid-State Circuits, vol. 38, No. 11, Nov. 2003.

Sidiropoulos, et al., "SA 20.2: A Semi-Digital DLL with Unlimited Phase Shift Capability and 0.08-400MHz Operating Range," Center for Integrated Systems, Stanford University, Stanford, CA, Admitted Prior Art, no date.

(Continued)

*Primary Examiner*—Tuan T. Lam
*Assistant Examiner*—William Hernandez
(74) *Attorney, Agent, or Firm*—Myers Bigel Sibley & Sajovec PA (57) ABSTRACT

Clock generators include phase-locked and delay-locked loop integrated circuits that support efficient high speed testing of clock frequencies. An integrated circuit device is provided with a clock signal generator having at least one delay element therein that is responsive to a control signal. A speed tracking circuit is also provided. This speed tracking circuit is configured to generate a signal having a measurable characteristic that tracks changes in a property of the control signal that influences a delay of the at least one delay element.

13 Claims, 7 Drawing Sheets

OTHER PUBLICATIONS

Maneatis, John G., "FA8.1 Low-Jitter and Process-Independent DLL and PLL Based on Self-Biased Techniques," IEEE International Solid-State Circuits Conference, Digest of Technical Papers, pp. 130-132, no date.

Maneatis, John G., Low-Jitter Process-Independent DLL and PLL Based on Self-Biased Techniques, High Speed CMOS IC Lab, Postech, Dec. 24, 2004, http://aslc.postech.ac.kr/3.Class/1.Classes/04_695v/1224bjh.pdf.

* cited by examiner

LOCKED-LOOP INTEGRATED CIRCUITS HAVING SPEED TRACKING CIRCUITS THEREIN

FIELD OF THE INVENTION

The present invention relates to integrated circuit devices and, more particularly, to integrated circuit devices having clock generators therein and methods of generating clock signals.

BACKGROUND OF THE INVENTION

Phase-locked loop (PLL) and delay-locked loop (DLL) integrated circuits are frequently used to generate highly accurate internal clock signals on integrated circuit substrates (e.g., chips). However, such conventional PLL and DLL integrated circuits are frequently susceptible to unwanted clock skew and jitter as clock speed and circuit integration levels are increased and supply and substrate noise becomes more significant. In particular, PLLs typically suffer from phase error accumulation that may persist for long periods of time in noisy environments, whereas DLLs may have lower jitter performance because phase error accumulation does not occur. Thus, DLLs may offer an important alternative to PLLs in cases where a reference clock signal comes from a low-jitter source. However, DLLs typically cannot be used in applications where frequency tracking is required, such as frequency synthesis and clock recovery. DLLs may also be difficult to design for environments that experience significant process, voltage and temperature (PVT) variations.

PLL and DLL self-biasing techniques, which have been developed to address some of these limitations associated with conventional PLL and DLL integrated circuits, can provide a bandwidth that tracks operating frequency. This tracking of the bandwidth typically supports a broad frequency range and may minimize supply and substrate noise-induced jitter. These and other aspects of conventional self-biasing techniques are more fully described in an article by J. Maneatis, entitled "Low-Jitter Process-Independent DLL and PLL Based on Self-Biased Techniques," IEEE Journal of Solid-State Circuits, Vol. 31, No. 11, pp. 1723–1732, November (1996).

Figure 1:
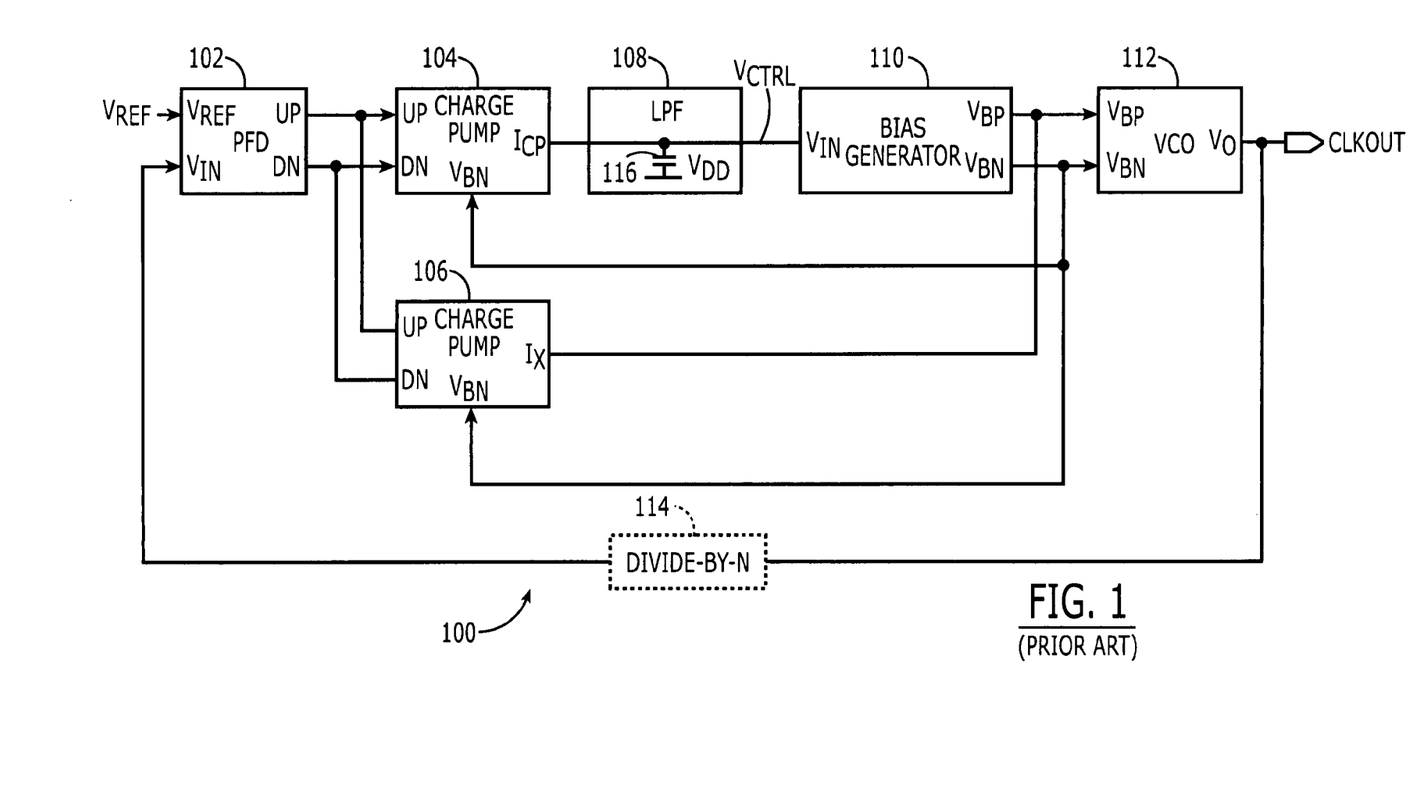
FIG. 1 is a block diagram of a conventional self-biased phase-locked loop (PLL) integrated circuit.
Figure 2:
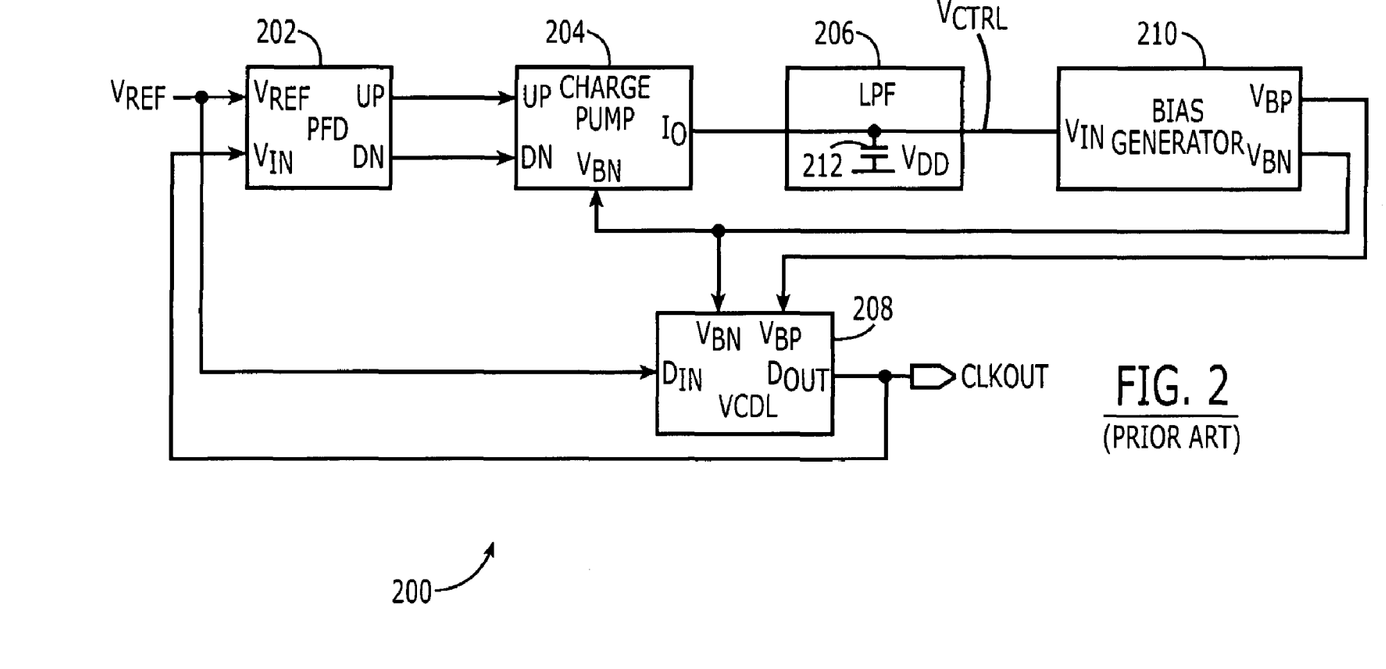
FIG. 2 is a block diagram of a conventional self-biased delay-locked loop (DLL) integrated circuit.

FIG. 1 illustrates a conventional self-biased phase-locked loop (PLL) integrated circuit 100. This PLL integrated circuit 100 includes: a phase-frequency detector 102, first and second charge pumps 104, 106, a low pass filter 108 (containing a large capacitor 116), a bias generator 110, a voltage-controlled oscillator 112 and a divide-by-N feedback circuit 114, connected as illustrated. The inclusion of a pair of charge pumps 104, 106 supports a self-biasing configuration within the PLL integrated circuit 100 by allowing all bias currents and voltages to be referenced to other generated bias voltages and currents, which are established by the operating frequency. FIG. 2 illustrates a conventional self-biased delay-locked loop (DLL) integrated circuit 200. This DLL integrated circuit 200 includes: a phase-frequency detector 202, a charge pump 204, a low pass filter 206 (containing a large capacitor 212), a bias generator 210 and a voltage-controlled delay line (VCDL) 208, connected as illustrated. As will be understood by those skilled in the art, the feedback of the bias signal VBN to an input of the charge pump 204 supports a self-biasing configuration within the DLL integrated circuit 200. FIGS. 1 and 2 are equivalent to FIGS. 1 and 5 of U.S. Pat. No. 5,727,037 to Maneatis. Additional PLL integrated circuits that utilize multiple charge pumps to support self-biased operation are disclosed in U.S. Pat. Nos. 6,329,882 and 6,894,569 to Fayneh et al.

An integrated circuit chip that supports high speed serial/deserial (SERDES) operations may include many (e.g., >10) PLL integrated circuits that must run at target speeds (e.g., multi-GHZ frequencies) if the chip is to pass speed testing upon manufacture. One conventional technique to perform speed testing of PLL integrated circuits includes dividing down a high frequency PLL output clock signal by an integer N and measuring the number of cycles of the divided clock signal over a reference time interval ((cycles/time) N=PLL clock frequency). As will be understood by those skilled in the art, the start and stop times of the reference time interval may be established by a reference counter that is responsive to a reference clock signal and the number of cycles of the divided clock signal may be measured by a target counter coupled to an output of the reference counter, which sets the start and stop time points. Unfortunately, such conventional speed testing techniques typically cannot be performed at the wafer level (e.g., prior to chip packaging) and may require the use of relatively large counters and long test times to identify relatively small fluctuations in the frequency of a PLL clock signal relative to the target frequency. Accordingly, to save manufacturing costs and simplify test board design, speed testing of PLL integrated circuits should be performed as simply and as early in the chip manufacturing process as possible (e.g., at the wafer level) and should avoid the use of large test circuits (e.g., large counters).

SUMMARY OF THE INVENTION

Embodiments of the present invention include phase-locked and delay-locked loop integrated circuits that support efficient high speed testing of clock frequencies. According to some of these embodiments, an integrated circuit device is provided with a clock signal generator having at least one delay element therein that is responsive to a control signal. A speed tracking circuit is also provided. This speed tracking circuit is configured to generate a signal having a measurable characteristic that tracks changes in a property of the control signal that influences a delay of the at least one delay element. In some cases, the measurable characteristic may be a voltage of a signal and the property of the control signal may be its magnitude. In other cases, the measurable characteristic may be a frequency or phase of the signal, for example.

Typical embodiments of the clock signal generator include a self-biased phase-locked loop (PLL) integrated circuit and a self-biased delay-locked loop (DLL) integrated circuit. If the clock signal generator is a PLL integrated circuit, then a bias signal generator and a voltage-controlled oscillator (VCO) may be provided. The bias signal generator is configured to generate a bias voltage in response to a control voltage and the voltage-controlled oscillator is responsive to the bias voltage. The bias signal generator may be configured so that the bias voltage will track up and down changes in the control voltage. A speed tracking circuit is also provided. This speed tracking circuit is configured to support efficient speed testing by generating an output signal that tracks changes in a magnitude of the control voltage and also indirectly tracks changes in the bias voltage. In particular, the speed tracking can be configured to generate an output voltage having a magnitude that is offset from the magnitude of the control voltage, which may be offset from a magnitude of the bias voltage. This output voltage generated by the speed tracking circuit may be readily measured during wafer level yield testing to thereby improve testing efficiency and reduce manufacturing costs.

According to further embodiments of the present invention, a phase-locked loop (PLL) integrated circuit is provided that supports efficient high speed testing. This PLL integrated circuit includes a bias signal generator configured to generate a bias voltage in response to at least one control voltage and a voltage-controlled oscillator configured to generate a clock signal in response to the bias voltage. A speed tracking circuit is also provided. The speed tracking circuit is configured to generate an output signal having a magnitude or other measurable characteristic (e.g, frequency, phase, etc.) that indicates whether or not a frequency of the clock signal is within a target range of acceptable frequencies.

Additional embodiments of the invention include delay-locked loop (DLL) integrated circuits. These DLL integrated circuits include a bias signal generator configured to generate a bias voltage in response to at least one control voltage and a voltage-controlled delay line configured to generate a clock signal in response to at least one bias voltage and a received clock signal (e.g., REFCLK). A speed tracking circuit is also provided. The speed tracking circuit is configured to generate an output signal having a measurable characteristic that indicates whether or not a frequency of the clock signal is within a target range of acceptable frequencies.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3A:
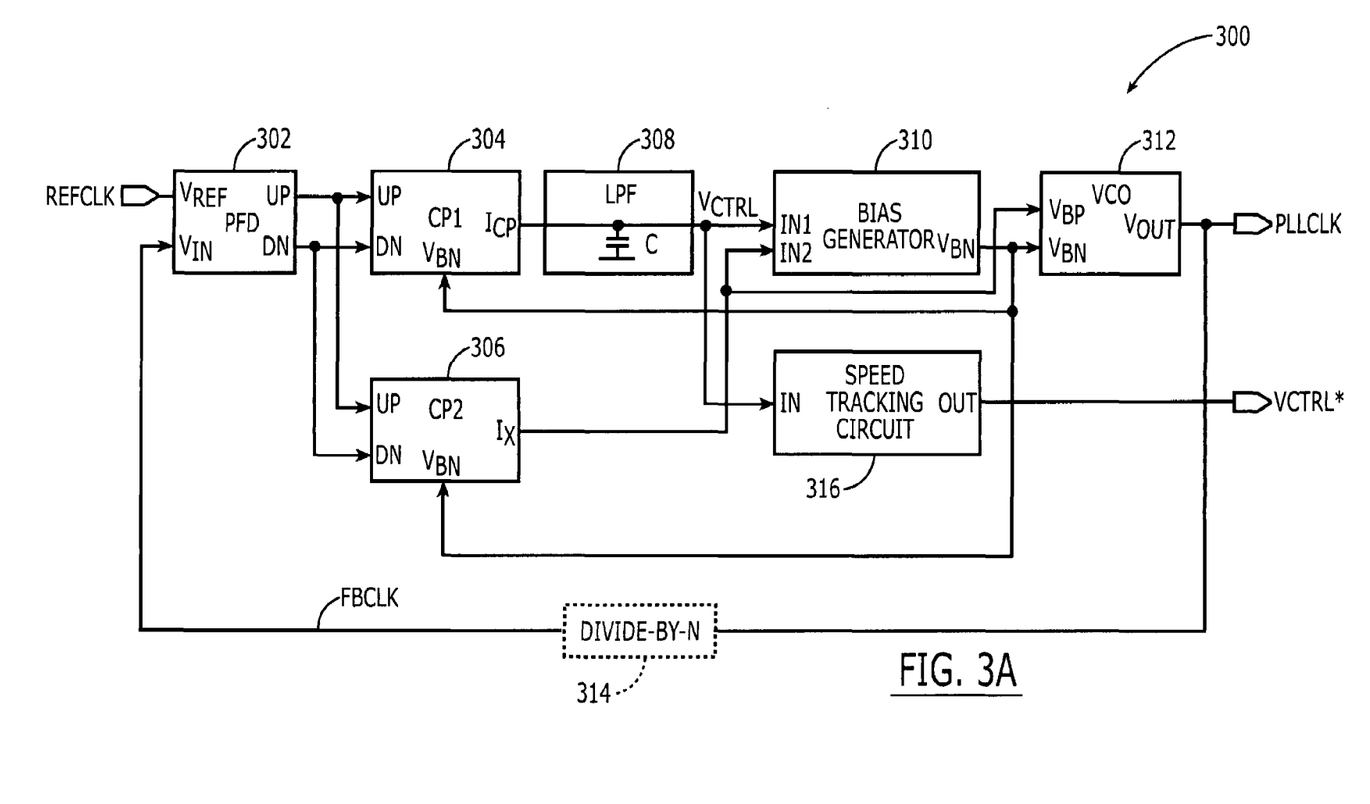
FIG. 3A is a block diagram of a self-biased phase-locked loop (PLL) with control voltage tracking, according to embodiments of the present invention.

Referring now to FIG. 3A, a self-biased phase-locked loop (PLL) 300 according to an embodiment of the present invention includes: a phase-frequency detector (PFD) 302, first and second charge pumps (CP1, CP2) 304, 306, a low pass filter 308, a bias signal generator 310, a voltage-controlled oscillator (VCO) 312, a divide-by-N feedback circuit 314 and a speed tracking circuit 316, connected as illustrated. The phase-frequency detector 302 is responsive to a reference clock signal REFCLK, which is provided to a first input terminal (VREF), and a feedback clock signal FBCLK, which is provided to a second input terminal (VIN). This feedback clock signal FBCLK is generated by a feedback circuit 314, which is configured to divide a period of a generated clock signal (PLLCLK) by an integer amount. The PLL 300 is configured to generate a high frequency output clock signal (PLLCLK) that is locked in phase to the reference clock signal REFCLK, which may have a lower frequency than the generated clock signal PLLCLK.

The phase-frequency detector 302 generates UP and DN control signals, which are provided as input signals to a pair of charge pumps 304, 306. In response to the UP and DN control signals, the first and second charge pumps 304, 306, which are also responsive to a fed back control signal (shown as bias signal VBN), generate respective output signals ICP and IX (i.e., current signals), as illustrated. These first and second charge pumps 304, 306 may have equivalent configurations to thereby support efficient self-biasing of the PLL 300. These and other aspects of operation and construction of the phase-frequency detector 302 and the first and second charge pumps 304, 306 are well known to those skilled in the art and need not be described further herein. The output signal ICP is provided to the low pass filter 308, which is shown in simplified form as a capacitor (C) having a relatively large capacitance value. The signal at the output of the low pass filter 308 represents a control voltage (VCTRL) that is provided as an input to a first input terminal (IN1) of the bias signal generator 310. The output signal IX, which is generated by the second charge pump 306, is passed to a second input terminal (IN2) of the bias signal generator 310 and as a bias input to the voltage-controlled oscillator 312. Although not shown, the output signal IX may also be passed through a filter, such as a ripple low pass filter containing a relatively small capacitor.

Figure 3B:
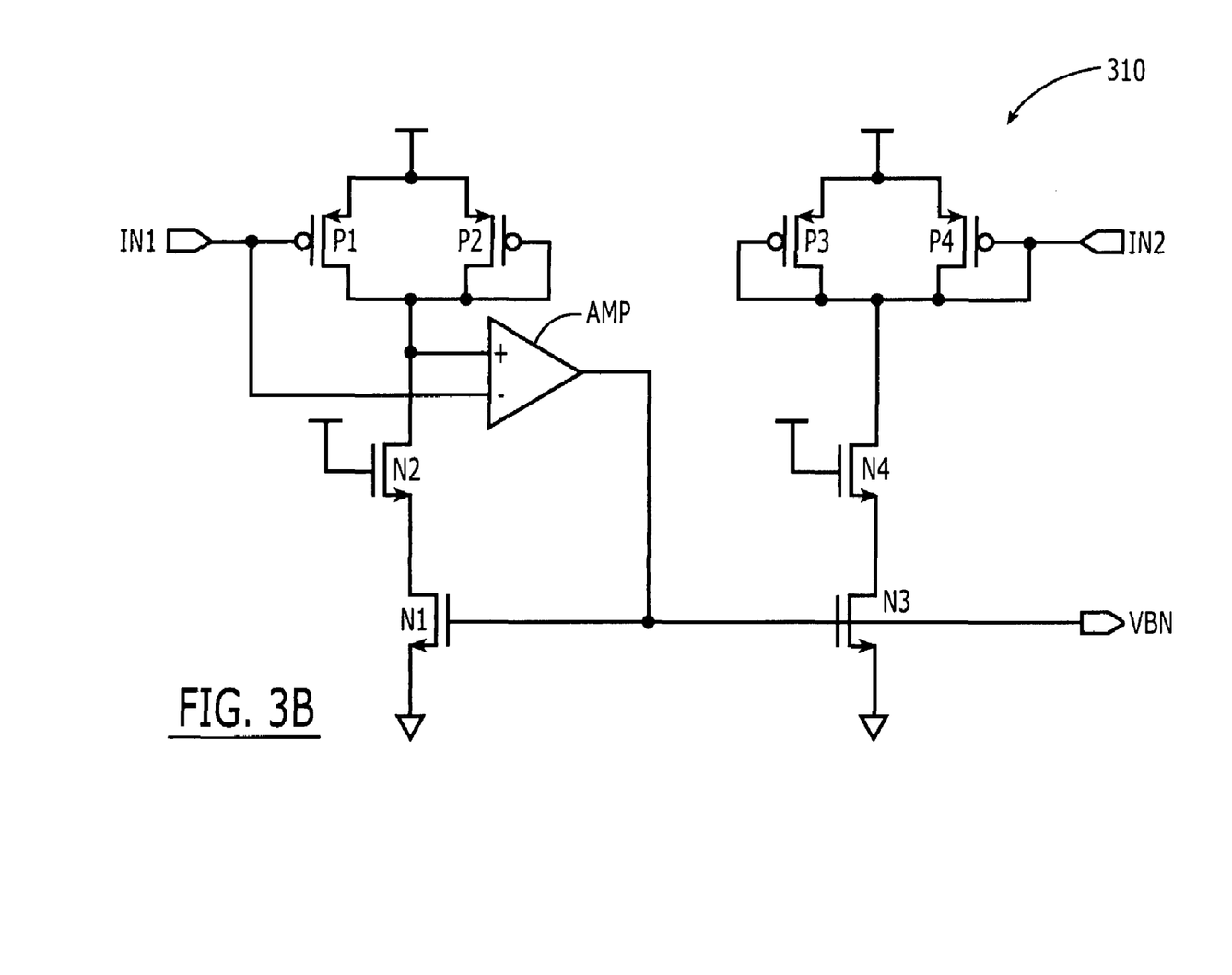
FIG. 3B is an electrical schematic of an embodiment of the bias signal generator illustrated by FIG. 3A.
Figure 3C:
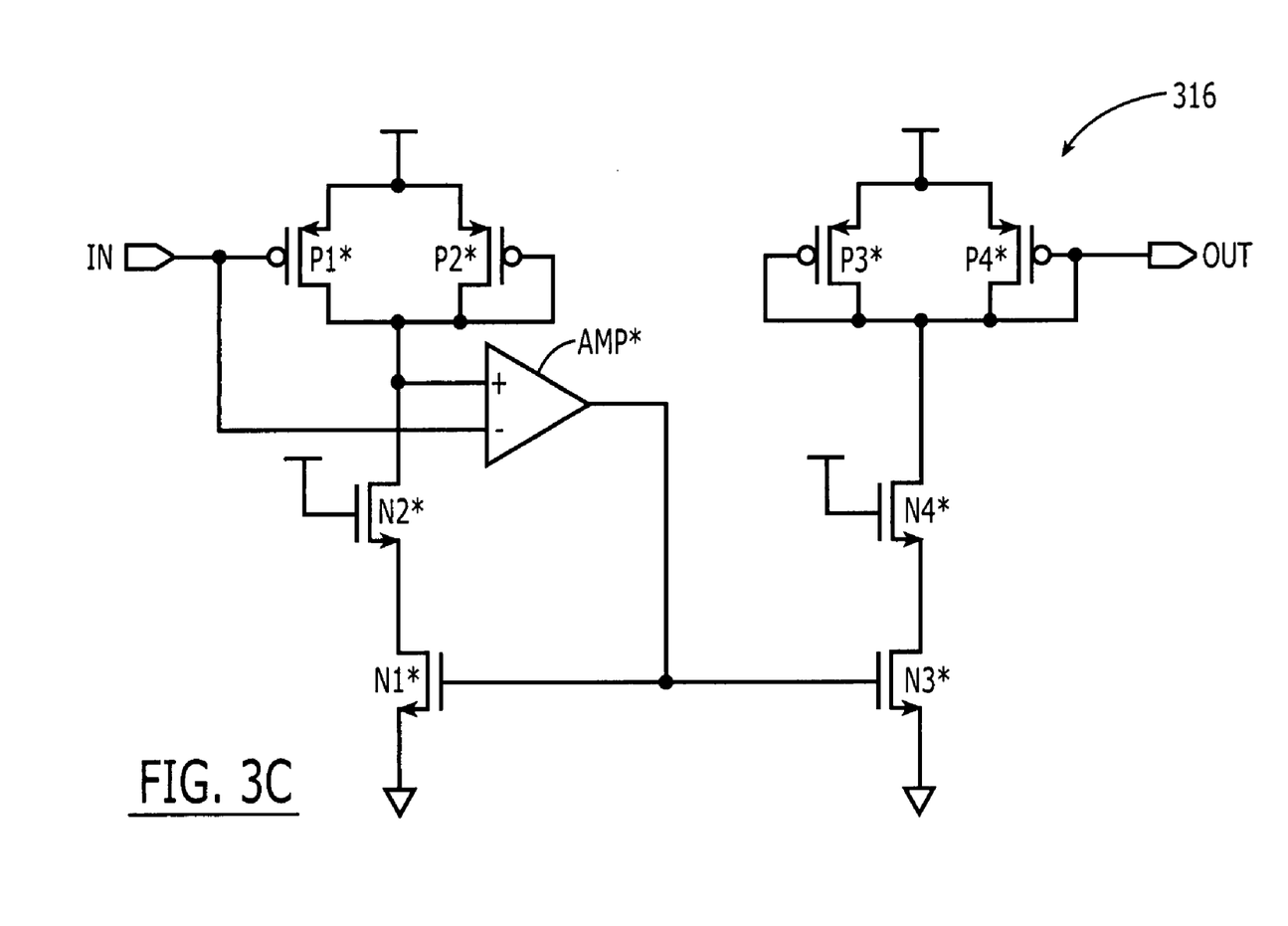
FIG. 3C is an electrical schematic of an embodiment of the speed tracking circuit illustrated by FIG. 3A.

Exemplary embodiments of the bias signal generator 310, speed tracking circuit 316 and voltage-controlled oscillator 312 will now be described more fully with reference to FIGS. 3B–3D. In particular, FIG. 3B illustrates a bias signal generator 310 that is configured to generate a control signal (e.g., bias signal VBN) in response to the control voltage (VCTRL) provided to the first input terminal IN1 and the output signal IX provided to the second input terminal IN2. The bias signal generator 310 includes four PMOS transistors P1–P4, four NMOS transistors N1–N4 and an operational amplifier (AMP), connected as illustrated. The NMOS transistors N2 and N4 are biased to be normally-on transistors. The output of the operational amplifier AMP drives gate terminals of NMOS transistors N1 and N3. In particular, the operational amplifier AMP operates to bias the NMOS transistor N1 so that the "+" terminal of the AMP, which is commonly connected to drain terminals of the PMOS transistors P1 and P2, tracks the voltage at the first input terminal IN1 (i.e., the voltage at the "−" terminal of the AMP). The output of the operational amplifier AMP also operates to generate the bias signal VBN, which is level-shifted relative to the voltage at the first input terminal IN1 (i.e., VBN=−VCTRL+α, where α is an offset voltage). The bias signal generator 310 is also configured so that the drain-to-source current in the NMOS transistor N2 is mirrored as the drain-to-source current in the NMOS transistor N4. The magnitude of the drain-to-source current is also influenced by a magnitude of the voltage at the second input terminal IN2. As illustrated by FIG. 3A, this second input terminal IN2 receives the output signal IX (a current signal) generated by the second charge pump 306.

Figure 3D:
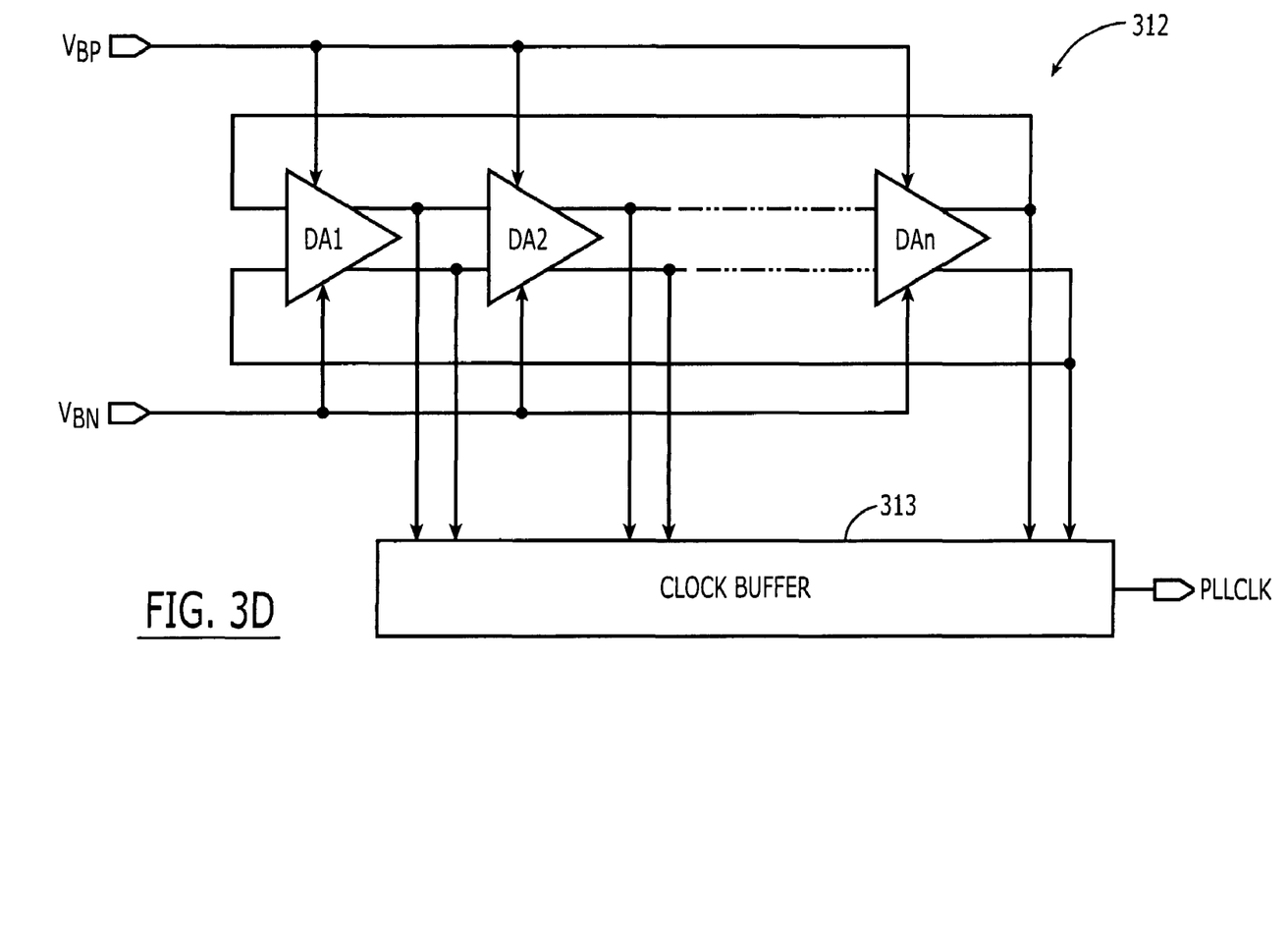
FIG. 3D is an electrical schematic of an embodiment of the voltage control oscillator illustrated by FIG. 3A.

Referring now to FIG. 3D, the voltage-controlled oscillator 312 is illustrated as including a plurality of differential amplifier stages DA1, DA2, . . . , DAn, which are electrically connected together in a ring oscillator configuration. The delay provided by each of these differential amplifier stages DA1, . . . , DAn, is controlled in a conventional manner by a magnitude of the signals VBN and VBP. The PLL 300 may also be configured to drive the magnitude of the control voltage VCTRL and the bias signal VBN, which tracks changes in the control voltage, out of their respective acceptable ranges and saturate whenever phase locking between the reference clock signal REFCLK and the feedback clock signal FBCLK cannot be achieved. For example, if an acceptable range for the magnitude of the control voltage VCTRL during accurate phase-locked operation is between 450 mV and 750 mV, an unacceptable value of the control voltage VCTRL, which reflects in inability for the PLL 300 to achieve phase locking, may be below about 250 mV. This provides about a 200 mV offset (e.g., guard band) between the lowest acceptable control voltage and the highest unacceptable control voltage. These ranges of acceptable and unacceptable voltages map to corresponding ranges of acceptable and unacceptable voltages associated with the bias signal VBN.

Each differential output of each stage DA1, . . . , DAn is provided as an input to a clock buffer circuit 313, which generates the output clock signal PLLCLK using conventional techniques. As will be understood by those skilled in the art, each differential output of each stage DA1, . . . , DAn generates a distinct phase of the output clock signal PLLCLK. Thus, if four stages are provided within the voltage-controlled oscillator 312, the clock buffer 313 will receive eight clock signals that are separated in phase by multiples of 45° (i.e., 360°/8).

Referring again to the bias generator 310 of FIG. 3B, the bias signal VBN may be driven out of an acceptable range of voltages when the PLL 300 is unable to achieve a stable locking condition between the output clock signal PLLCLK and the reference clock signal REFCLK. In order to efficiently identify when the PLL 300 fails to achieve a stable locking condition, the speed tracking circuit 316 of FIG. 3C generates an output signal OUT (shown as VCTRL* in FIGS. 3A and 4) having a measurable characteristic (e.g., magnitude, frequency, phase, etc.) that identifies whether a magnitude of the bias signal VBN is within or without an acceptable range. This speed tracking circuit 316 includes four PMOS transistors P1*–P4*, four NMOS transistors N1*–N4* and an operational amplifier (AMP*), connected as illustrated. The NMOS transistors N2* and N4* are biased to be normally-on transistors. The output of the operational amplifier AMP* drives gate terminals of NMOS transistors N1* and N3*. The vertical configuration of PMOS transistors P3* and P4* and NMOS transistors N4* and N3* supports the generation of an output signal OUT having a magnitude that is slightly offset relative to the voltage at the gate terminals of NMOS transistors N1* and N2*, which is itself slightly offset relative to the magnitude of the voltage at the input terminal IN (i.e., gate of PMOS transistor P1*). This input terminal IN provides no appreciable capacitive loading to the output of the low pass filter 308, particularly when compared to the magnitude of the large capacitor C, and does not add appreciable noise to the control voltage. Accordingly, the output signal OUT (shown as VCTRL* in FIGS. 3A and 4) can be readily measured during wafer level testing to identify whether the control voltage VCTRL and bias voltage VBN are within respective acceptable ranges that indicate stable phase-locking of the PLL 300. The actual value of the control voltage VCTRL may also be used to classify parts within a range of acceptable performance levels.

Figure 4:
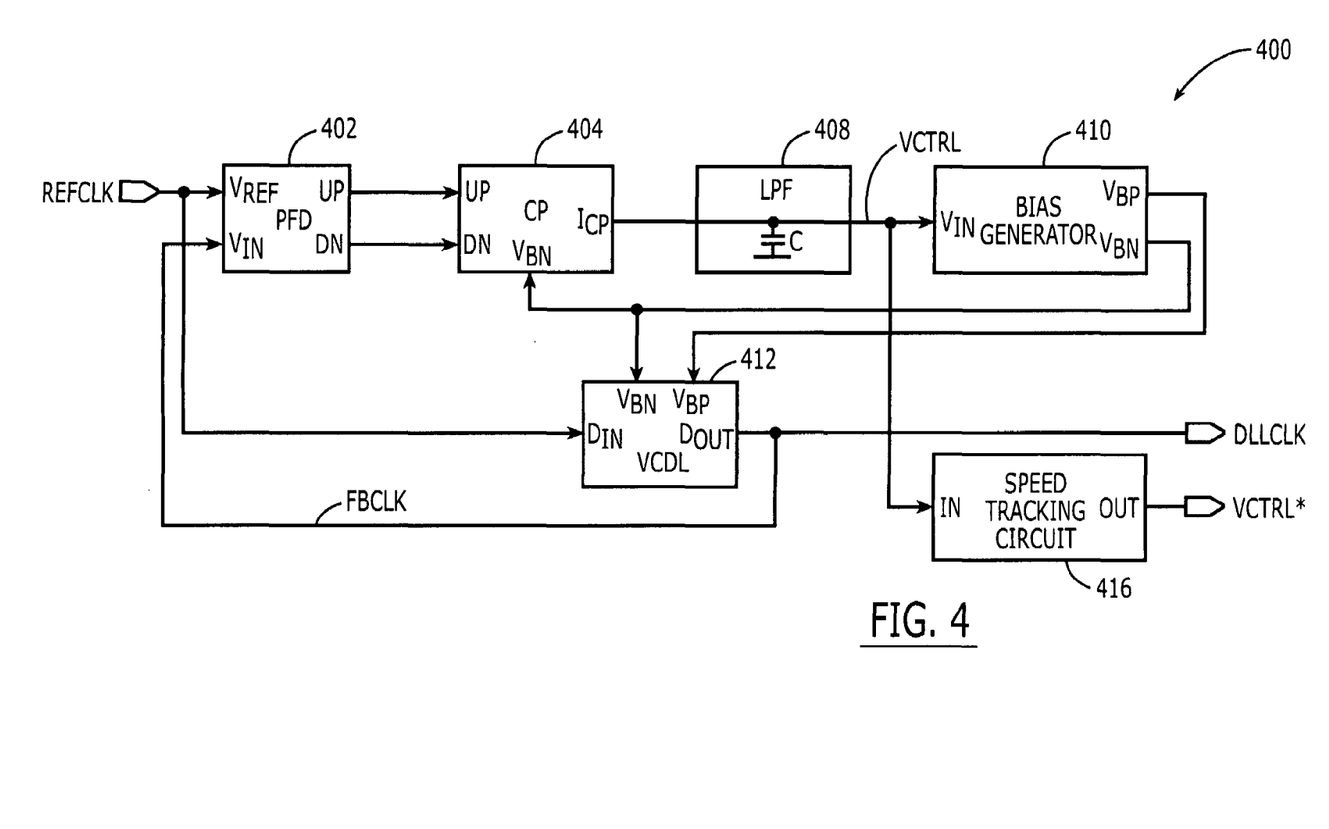
FIG. 4 is a block diagram of a self-biased delay-locked loop (DLL) with control voltage tracking, according to embodiments of the present invention.

Referring now to FIG. 4, a self-biased delay-locked loop (DLL) 400 according to an embodiment of the present invention includes: a phase-frequency detector (PFD) 402, a charge pump (CP) 404, a low pass filter 408, a bias signal generator 410, a voltage-controlled delay line (VCDL) 412 and a speed tracking circuit 416, connected as illustrated. The voltage-controlled delay line 412 may include a plurality of delay stages that are responsive to a pair of bias signals VBN and VBP that operate to set the delay provided by each stage. The phase-frequency detector 402 is responsive to a reference clock signal REFCLK, which is provided to a first input terminal (VREF), and a feedback clock signal FBCLK, which is provided to a second input terminal (VIN). This feedback clock signal corresponds to the output clock signal DLLCLK generated by the voltage-controlled delay line 412. The DLL 400 is configured to generate a high frequency output clock signal (DLLCLK) that is locked in phase to the reference clock signal REFCLK, which has an equivalent frequency. As described above with respect to FIG. 3C, the speed tracking circuit 416, which may be equivalent to the speed tracking circuit 316, generates an output voltage (shown as VCTRL*) that can be easily measured to identify whether the control voltage VCTRL and bias voltage VBN are within respective acceptable ranges that indicate stable phase-locking of the DLL 400.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a phase-locked loop integrated circuit having at least one delay element therein that is responsive to a control voltage, said phase-locked loop integrated circuit comprising a bias signal generator configured to generate a first bias voltage and a voltage-controlled oscillator responsive to the first bias voltage; and
a speed tracking circuit configured to generate a signal having a measurable characteristic that tracks changes in a property of the control signal that influences a delay of said at least one delay element;
wherein said speed tracking circuit and the bias signal generator are substantially similar circuits.

2. The integrated circuit device of claim 1, wherein the bias signal generator is responsive to the control voltage; and wherein said speed tracking circuit is configured to generate a signal that tracks changes in a magnitude of the control voltage.

3. The device of claim 2, wherein the phase-locked loop integrated circuit further comprises a low pass filter; and wherein the control voltage is generated at an output of the low pass filter.

4. The device of claim 3, wherein said speed tracking circuit is configured to generate a voltage having a magnitude that is offset from the magnitude of the control voltage.

5. The device of claim 2, wherein said speed tracking circuit is configured to generate a voltage having a magnitude that is offset from the magnitude of the control voltage.

6. A phase-locked loop integrated circuit, comprising:
a bias signal generator configured to generate a bias voltage in response to at least one control voltage;
a voltage-controlled oscillator configured to generate a clock signal in response to the bias voltage;
a speed tracking circuit configured to receive the at least one control voltage and to generate an output signal having a magnitude that indicates whether or not a frequency of the clock signal is within a target range of acceptable frequencies;
a phase frequency detector configured to generate up and down control signals in response to a reference clock signal and a feedback clock signal;
a first charge pump configured to generate a first pump output signal in response to the up and down control signals; and
a second charge pump configured to generate a second pump output signal in response to the up and down control signals.

7. The phase-locked loop integrated circuit of claim 6, further comprising a low pass filter configured to generate the at least one control voltage in response to the first pump output signal.

8. The phase-locked loop integrated circuit of claim 7, wherein said speed tracking circuit is responsive to the at least one control voltage.

9. The phase-locked loop integrated circuit of claim 8, wherein the output signal generated by said speed tracking circuit is configured to track up and down fluctuations in the bias voltage.

10. A delay-locked loop integrated circuit, comprising:
a bias signal generator configured to generate a bias voltage in response to at least one control voltage;
a voltage-controlled delay line configured to generate an output clock signal in response to the bias voltage and an input clock signal; and
a speed tracking circuit configured to receive the at least one control voltage and to generate an output signal having a magnitude that indicates whether or not a frequency of the output clock signal is within a target range of acceptable frequencies; wherein said speed tracking circuit and the bias signal generator are substantially similar circuits.

11. The delay-locked loop integrated circuit of claim 10, wherein said speed tracking circuit is responsive to the at least one control voltage.

12. The delay-locked loop integrated circuit of claim 11, wherein the output signal generated by said speed tracking circuit is configured to track up and down fluctuations in the bias voltage.

13. A phase-locked loop integrated circuit, comprising:
a bias signal generator configured to generate a bias voltage in response to at least one control voltage;
a voltage-controlled oscillator configured to generate a clock signal in response to the bias voltage; and
a speed tracking circuit electrically configured to receive the at least one control voltage and to generate a signal having a measurable characteristic that tracks changes in a property of the at least one control voltage ; wherein said speed tracking circuit and the bias signal generator are substantially similar circuits.

* * * * *